United States Patent

Rosa

[11] 4,174,495
[45] Nov. 13, 1979

[54] STATIC CURRENT LIMITING SWITCH WITH SOFT FORCED COMMUTATION

[75] Inventor: John Rosa, Penn Hills, Pa.

[73] Assignee: Westinghouse Electric Corp., Pittsburgh, Pa.

[21] Appl. No.: 921,020

[22] Filed: Jun. 30, 1978

[51] Int. Cl.² .......................................... H02H 7/00
[52] U.S. Cl. ......................................... 323/9; 323/24; 361/58
[58] Field of Search ....................... 363/50, 54, 57, 85, 363/88, 128, 138; 323/9, 23, 24, 25; 361/58; 307/252 Q, 252 T, 252 M

[56] References Cited

U.S. PATENT DOCUMENTS

| | | | |
|---|---|---|---|
| 3,558,983 | 1/1971 | Steen | 363/54 X |
| 3,629,613 | 12/1971 | Feige | 307/252 T X |
| 3,710,230 | 1/1973 | Venard | 363/138 |
| 3,723,816 | 3/1973 | Pollard | 361/58 |
| 3,725,742 | 4/1973 | Pollard | 307/252 T X |
| 3,737,759 | 6/1973 | Pollard | 363/138 |
| 3,890,561 | 6/1975 | Demarest | 323/24 |
| 3,921,038 | 11/1975 | Kernick et al. | 363/54 X |
| 4,131,927 | 12/1978 | Tsuchiya et al. | 323/9 X |

Primary Examiner—William M. Shoop
Assistant Examiner—Peter S. Wong
Attorney, Agent, or Firm—M. J. Moran

[57] ABSTRACT

Disclosed is a force commutated static switch composed of inverse parallel connected thyristors. A bilateral commutation circuit is connected across the thyristors. The commutation circuit includes a switched capacitor which, during a current commutation interval, provides the dual functions of contributing to the current commutation operation and of acting as a current source for one of the thyristors. The capacitor discharge current interacts with the intrinsic resistance of the thyristor to provide a relatively low forward voltage drop which is a reverse voltage drop for the other thyristor. The low reverse voltage is known as soft biasing voltage. This voltage is utilized in conjunction with the most recently turned off thyristor to prevent reconduction thereof during the critical recovery time of the thyristor. The commutation circuit cooperates with its control circuit to provide an abort capability for its current limiting operation. Furthermore, the commutating circuit cooperates with its control circuit to eliminate repeated current reversals of the capacitor's discharge current.

17 Claims, 8 Drawing Figures

STATIC CURRENT LIMITING SWITCH WITH SOFT FORCED COMMUTATION

BACKGROUND OF THE INVENTION

The subject matter of this invention is related to a static, current-limiting, bilateral force commutated switch with a reverse parallel pair of thyristor stacks as the main conduction element.

It has been long known that current limiting in an electrical circuit subject to high values of overload current is desirable. In the fuse art, for example, current limiting fuses are known which not only melt upon the presence of an overload but operate to reduce the amount of overload current during the short interval between the time that circuit interruption begins and the time that circuit interruption is completed. It has been long recognized that in the latter time interval though of relatively short duration, perhaps only a few hundred microseconds, there is sufficient time for the current in the circuit to rise to such a high value as to permanently damage those elements for which the circuit protective device was designed to protect. Analogously, certain current limiting apparatus is known in electrical circuits protected by circuit breakers, non-current limiting fuses or the like. Take the case of mechanical circuit breaker apparatus, for example. Generally these devices are highly reliable and well thought of in the art of circuit interruption. However, since they are mechanical devices, interruption time may become relatively long. As was mentioned previously, the value to which a fault current may rise in these relatively long circuit opening times can become prohibitive in terms of protection for the circuit. To remedy this the concept of utilizing a force commutated circuit in series with the mechanical circuit breaker was introduced into the art. The circuit essentially consists of oppositely disposed, parallel connected, unidirectional, solid state devices such as thyristors. Connected across the oppositely disposed thyristors is a relatively high resistive element for current limiting and a commutating circuit. In operation, the control circuit for the gates of the thyristors maintains the thyristors in a conductive state for alternating current during a normal operating situation. Consequently, the normal operating alternating current sees the relatively small resistance or forward voltage drop of a thyristor during each half cycle. Even when peak inverse voltage constraints in the circuit require that numerous thyristors be connected in series stacks, the net resistive effect and voltage drop effect though somewhat undesirable is usually deemed acceptable in view of the very desirous current limiting operation provided by the commutating circuit and resistive means which parallels the normally conducting thyristors. In the event of the onset of a fault current or the like, appropriate sensing apparatus associated with the commutating circuit quickly determines that a fault current of unacceptable magnitude is in the process of developing. The sensing circuit then quickly reacts to this phenomenon by deenergizing the gates of the thyristors, thus attempting to render the thyristor non-conductive. Furthermore, the sensing circuit switches the commutating circuit into operation. The commutating circuit usually consists of a precharged capacitor which sinks current away from the conducting thyristor and through the capacitor. It does this very quickly, often within a time span of a few microseconds. The reason for this is well known in the art. A thyristor will not stop conducting merely because its gate signal has been removed. Two additional characteristics must be satisfied before the thyristor will cease to conduct. First, the current flow in the thyristor must be reduced to zero and, second, the anode-to-cathode voltage of the thyristor must be reverse biased for a relatively short period of time (recovery time) to sweep out the carriers that might otherwise lead to reconduction. It can be seen therefore that the capacitor generally provides a dual function; it quickly sinks away the current from the main thyristor path thus reducing the current in that path to zero to meet the first characteristic, and it reverse biases the thyristor thus meeting the second requirement. In performing its second function, i.e. reverse biasing, the voltage of the capacitor is usually so high that its reverse biasing characteristic is known as "hard" reverse biasing. This is usually associated with high voltage but, more importantly, it is associated with utilizing the capacitor as a voltage source rather than a current source. Generally, the means for connecting the charged capacitor to the circuit for accomplishing its stated purposes is an auxiliary switching thyristor. Unfortunately the gating of the auxiliary switching thyristor may cause current to be commutated away from the main thyristor and into the capacitor circuit at such a high rate as to destroy the auxiliary thyristor. It is well known that thyristors have a maximum rate of rise of current with respect to time which they can tolerate without being destroyed. In order to solve this problem in the prior art, an inductor is used in series with the capacitor to limit the rate of current rise. When the main thyristor ceases to conduct in the prior art, the hard capacitor voltage appears across that thyristor, as reverse bias, and in series with the system voltage. This results in the first drawback of a hard commutation circuit; namely, since the system voltage is boosted by the capacitor voltage, the fault current rises even faster than before. The second drawback of a hard commutation circuit is that the current limiting resistor which is connected directly across the thyristor starts to deplete the capacitor charge from the moment the compensating branch is actuated. Consequently, a larger capacitor is needed to provide the necessary reverse bias time (recovery time) than would be needed if the resistance were not present. In prior art, U.S. Pat. No. 3,921,038 issued Nov. 18, 1975 to Kernick et al entitled "Static Surge-Current Limiter" and U.S. Pat. No. 3,737,759 issued June 5, 1973 to Pollard entitled "Static Switch Including Surge Suppressing Means", the latter-mentioned problem was circumvented by connecting a current limiting resistive element in series with a diode but in parallel with the capacitor. As a result, the circuit branch containing the resistor does not start to conduct until after the reverse bias interval is over. This saves commutating capacitance at the cost of utilizing a relatively high voltage diode which must have a short duration current rating equal to the limited transient fault current. The third drawback of a hard commutating circuit lies in the fact that the previously discussed inductance is utilized merely to limit the rate of rise of current through the discharge circuit. The presence of the inductance, though needed, actually degrades the circuit to a certain extent because reverse biasing of the thyristor will not start until after the entire line current has been commutated into the capacitor, by which time a non-negligible portion of the charge of the capacitor may have been depleted. In the previously mentioned prior art patents, a number of things were done to eliminate certain problems associated with the previous generation of current limiters. One of the things done was to introduce the concept of the "soft" commutation circuit. With soft commutators, the capacitive element acts not as a voltage source but as a current source. This soft commutating circuit implies that the conducting thyristor, i.e. the one to which the reverse bias must be supplied, is turned off by a very modest reverse bias voltage. This voltage is obtained by a resonant discharge of the precharged capacitor through an inductor and a diode connected in reverse across the conducting main thyristor. The forward voltage drop of the diode, therefore, appears as reverse voltage across the thyristor from the instant the capacitor discharge current rises above the value of the main current until the instant the capacitor discharge current drops below the value of the main current. During this interval, the thyristor is provided with soft reverse bias. It is immediately after this interval, but during the alternating current half cycle of interruption, that the net current which attempts to flow through the thyristor reverses again. That is, the capacitor discharge current falls below the value of the main current. However, with the thyristor now recovered and thus turned off and the diode blocking, the main current divides between the branch containing the resistive element and the commutating branch containing the capacitive element and the inductive element L. This soft commutating circuit removes one of the problems associated with the inductor. In this case, the inductor L no longer degrades the circuit, but is utilized in conjunction with the capacitor to tune the circuit to obtain the main current reversal. Furthermore, the other two drawbacks associated with hard biasing are also eliminated. First, the voltage inserted into the line is soft or of relatively low value. Thus, the circuit does not contribute significantly to the rate of increase of the fault current. Secondly, the resistive element utilized for current limiting, although directly in parallel with the thyristor switch, carries only negligible current. However, in overcoming the aforementioned drawbacks, other drawbacks appeared. One is the need for the utilization of a series of diodes stacked together for the purpose of carrying the discharge current of the capacitive element during the period of time when that current is larger than the main current to provide the previously described soft bias voltage. It is noted that in the prior art, these additional diode stacks are always present in the main current conduction path for the alternating current. Consequently, these stacks must be rated to continuously carry full load current and to support the system voltage plus transient overloads and thus constitute a significant cost item. Furthermore, the conduction losses in the diode may increase the switch losses by approximately 60% which is highly undesirable in high power applications. Therefore, it would be desirable if the utilization of the soft biasing principle but with elimination of the drawbacks associated therewith could be implemented. It would be further advantageous if the solution would utilize an existing circuit element to perform extra circuit functions above and beyond what was described in the prior art, thus providing a significant cost reduction. Furthermore, it would be advantageous if apparatus could be found which utilized the soft biasing technique in which the suppression of transients associated with a switching and commutating operation could be affected. Furthermore, it would be advantageous if a commutating circuit could be found in which repeated reversal of the capacitive discharge current could be permitted or denied as required.

SUMMARY OF THE INVENTION

In accordance with the invention a solid state commutating circuit is taught utilizing the soft biasing technique in which one of the oppositely oriented thyristors of the main conduction path is utilized in conjunction with a precharged capacitive element and inductive element to provide a tuned discharge of the capacitive element through the thyristor to establish sufficient reverse voltage for a sufficient period of time to accomplish the reverse biasing function of sweeping out the majority carriers in the other thyristor to prevent reconduction thereof. Furthermore, the apparatus taught herein utilizes surge suppression means across the main conduction elements and across the capacitive element to reduce the effects of the transients associated with switching and commutation. Also, the switchable capacitive means is so controlled by the control circuit for the commutating circuit, that repeated reversal of the discharge current due to "ringing" in the discharge circuit is reduced or completely eliminated by merely disconnecting the capacitor at an appropriate time by electronic or similar means. Finally, the tuned soft biasing technique may be utilized to abort the current limiting operation even after it has begun by regating the main conduction thyristor so that the gate terminal thereof is energized at the time that the tuned capacitor discharge current falls below the main circuit current thus causing reconduction in the main thyristor.

BRIEF DESCRIPTION OF THE DRAWINGS

For a better understanding of the invention, reference may be had to the preferred embodiments thereof shown in the accompanying drawings, in which.

DESCRIPTION OF THE PREFERRED EMBODIMENTS

Figure 1:
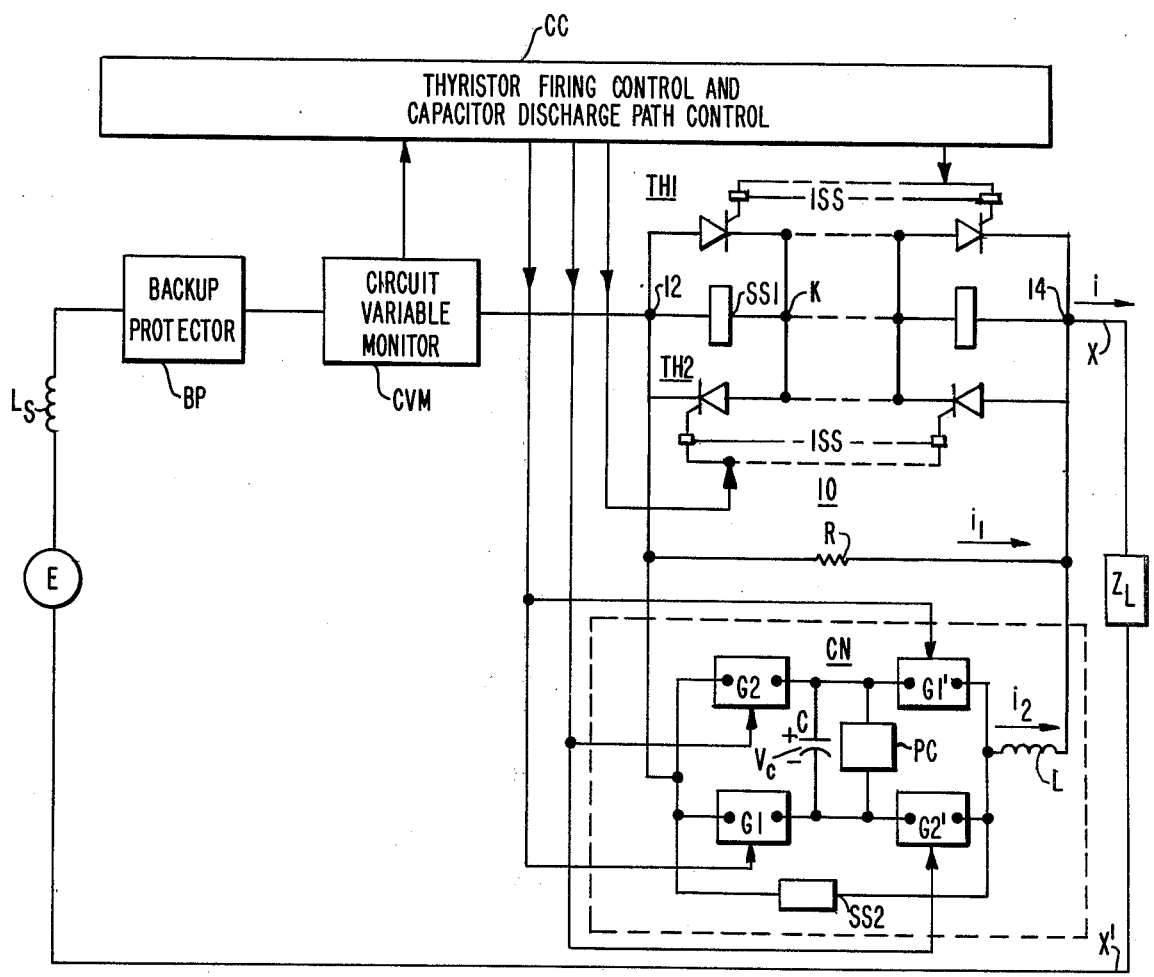
FIG. 1 shows a schematic diagram of an electrical circuit which includes a solid state current limiting commutation circuit embodying the principles of the present invention.

Referring now to the drawings and FIG. 1 in particular, a circuit which utilizes solid state or static commutation and current limiting is schematically portrayed. There is provided a source of alternating line current and associated voltage E. The source impedance is schematically represented in this case as an inductive element $L_S$. Serially connected with the previous combination of source E and impedance $L_S$ are four circuit elements representative of an alternating current circuit. One of the serially connected elements constitutes a load $Z_L$. This load is protected by a backup protector BP which may be a mechanical circuit breaker. There is also provided a commutating and current limiting circuit 10. The commutating and current limiting circuit 10 includes unidirectional gated devices or thyristors TH1 and TH2 connected in parallel polarity opposition with each other and in series with the previously described circuit devices so that, for example, positive half cycles of alternating current may flow through the thyristor TH1 during a first half cycle and negative cycles of alternating current may flow through thyristor TH2 during a second half cycle. Since the voltage of the source E may be extremely large in some circumstances, the thyristor elements TH1 and TH2 are shown in thyristor stacked arrangement. Connected in series with the main terminals 12 and 14 of the thyristor switch and in parallel with the thyristors is a current limiting element R. Connected in parallel with the current limiting resistive element R and with the thyristors TH1 and TH2 is a commutating network CN. The commutating network CN includes four spark gap switches G1, G1', G2 and G2'. One side each of the spark gaps G1 and G2 are connected together and to the first terminal 12 of the network 10 and one side of the spark gaps G1' and G2' are connected together and to one side of an inductive element L. The other side of the inductive element L is connected to the other terminal 14 of the commutating network 10. Connected to the other terminal of the spark gap G2 and the spark gap G1' is one side of a capacitive element C and one side of a capacitive element precharging network PC. The other side of the capacitive element C and the other side of the precharging network PC are connected together and to the other terminal of the spark gap G1 and the other terminal of the spark gap G2'.

Connected in parallel with the thyristor switches or switch stacks TH1 and TH2 as the case may be, are surge suppressing devices SS1 which may be zinc oxide surge suppressors, for example. Connected in parallel with the capacitive element C is a second surge suppressing element SS2 which may also be a zinc oxide device. This latter element is connected at one end thereof to the common connection between the spark gaps G2 and G1 (i.e. main terminal 12) and it is connected at the other end thereof to the common connection between the spark gaps G1' and G2' and the inductive element L. Since the spark gaps G2 and G2' are controlled in such a manner as to fire generally concurrently and since the spark gaps G1 and G1' are controlled to fire generally concurrently but at a different time than the other spark gaps, it can be seen that the capacitive element C is always connected in parallel with the surge suppressing device SS2 when one set or the other of the spark gaps has been fired.

The fourth element which is connected in series with the backup protector BP, the load $Z_L$, and the current limiting and commutating circuit 10, is a circuit variable monitor or sensing means CVM. The output from the circuit variable monitor or sensing means CVM is provided to a thyristor firing control and capacitor discharge path control CC. The thyristor firing control and capacitor discharge path control elements CC have four outputs, one of which is connected to the common gate control terminal of the thyristor stack TH1, another of which is connected to the common gate control terminal of the thyristor stack TH2, another of which is connected to fire the spark gap combination G2 and G2', and the last of which is connected to fire the spark gap combination G1 and G1'. Each of the thyristors in the thyristor stacks TH1 and TH2 have isolation stages ISS on their respective gate terminals.

The normal operation, that is the non-current imiting current commutating operation, of the circuit shown in FIG. 1 is relatively simple. Alternating current i generated by a source E alternates at a 60 hertz rate through the load $Z_L$ and the alternately conducting thyristors TH1 and TH2. The resistor R is essentially out of the circuit at thus time because the impedance of the forward conducting thyristor TH1 or TH2, during each alternation of the current i, is significantly lower in impedance and resistance value than the corresponding values of the resistor R. Consequently, only a small amount of current $i_1$ flows through the resistor R. The current $i_1$ is so small as to be generally negligible at this time. The inductive element L and the capacitive element C are essentially disconnected from the main current path by the open spark gaps G1, G1', G2 and G2'. The precharged network PC is utilized to charge the capacitive element C so that its voltage and current delivering capabilities may be utilized at an appropriate time during the current limiting operation.

CURRENT LIMITING/CURRENT COMMUTATING

By way of example, a current limiting and commutating operation will be described hereinafter. Presuming that the voltage at the source E is positive, which means thyristors TH1 are conducting and thyristors TH2 are not, the current i flows in the direction shown in FIG. 1. The onset of a fault at points X and X', for example, (which bypasses the current limiting load impedance $Z_L$), will be sensed by the current variable monitor CVM which will alert the thyristor firing control and capacitor discharge path control CC. This will cause removal of the gate signal of the thyristors TH1. Current $i_1$ is the current which flows through the resistance R as a result of the voltage appearing between terminals 12 and 14. If TH1 or TH2 are conducting, the voltage is low and $i_1$ is negligible. Note, thyristor TH1 will not actually cease to conduct until the positive half cycle of current i previously described has returned to zero. The time for this to occur may be so large that the current may rise to a level which is unacceptable and which may cause damage to equipment or personnel. Consequently, the forced commutation network CN must be brought into play to quickly remove the current of the thyristor TH1 and to conclude its conduction long before the present half cycle ends. This is done, in this instance, by gating the spark gaps G1 and G1' so that the capacitive element C is placed in series circuit relationship with the inductive element L, and both the capacitive element C and the inductive element L are connected to bypass the thyristor TH1. The voltage in the capacitive element C as thus connected, is in voltage opposition to the polarity of the thyristor TH1. This connection will result in the flow of a relatively large amount of current through the capacitive element and the inductive element L. The capacitive element C and the inductive element are tuned in such a manner that the resonant discharge cuttent $i_2$ from the capacitive element C rises to a relatively high level, such that current $i_2$ eventually exceeds the current i. When this happens by the normal operation of the laws of electricity and physics, the net current $i-i_2$ through the thyristor TH1 will be forced to zero thus meeting the second criteria for turning the thyristor element TH1 off ($i_1$ still negligible). Also, when this happens, the opportunity exits for forward biasing the thyristor element TH2 even though it would not normally be forward biased in this instance according to the polarity of the source voltage E. The thyristor element TH2 is turned on by way of the thyristor firing control and capacitor discharge path control CC so that the discharge current $i_2$ from the capacitive element C flows in tuned cooperation with the inductive element L. The latter current flows through the now forward biased and turned-on thyristor element TH2 creating a forward voltage drop thereacross, which in turn amounts to a reverse voltage bias for the thyristor element TH1. This voltage drop remains as long as the current $i_2$ exceeds the current i. The value of the capacitive element C and the inductive element L are chosen so that the latter current relationship ($i_2 > i$) extends for a period which is at least as long as the recovery time for the thyristor TH1. This provides the "soft" biasing previously described. During this period of time, the carriers of the thyristor TH1 are swept away from the main conducting junctions so that after the soft biasing voltage is removed, the thyristor TH1 will no longer conduct as long as the gate thereof is not retriggered even if the polarity of the voltage impressed thereacross is correct for conduction. If the circuit interruption and current limiting and commutation operation were commanded during the opposite half cycle of the source voltage current E, it would be the thyristor TH2 which was turned off, and the thyristor TH1 which would cooperate with the capacitive element C and the inductive element L to provide the soft biasing previously described. In the latter situation, the spark gaps G2 and G2' would be fired rather than the spark gaps G1 and G1'. This, of course, would place the capacitive element C in the proper polarity relationship for accomplishing the purposes previously discussed.

Figure 2:
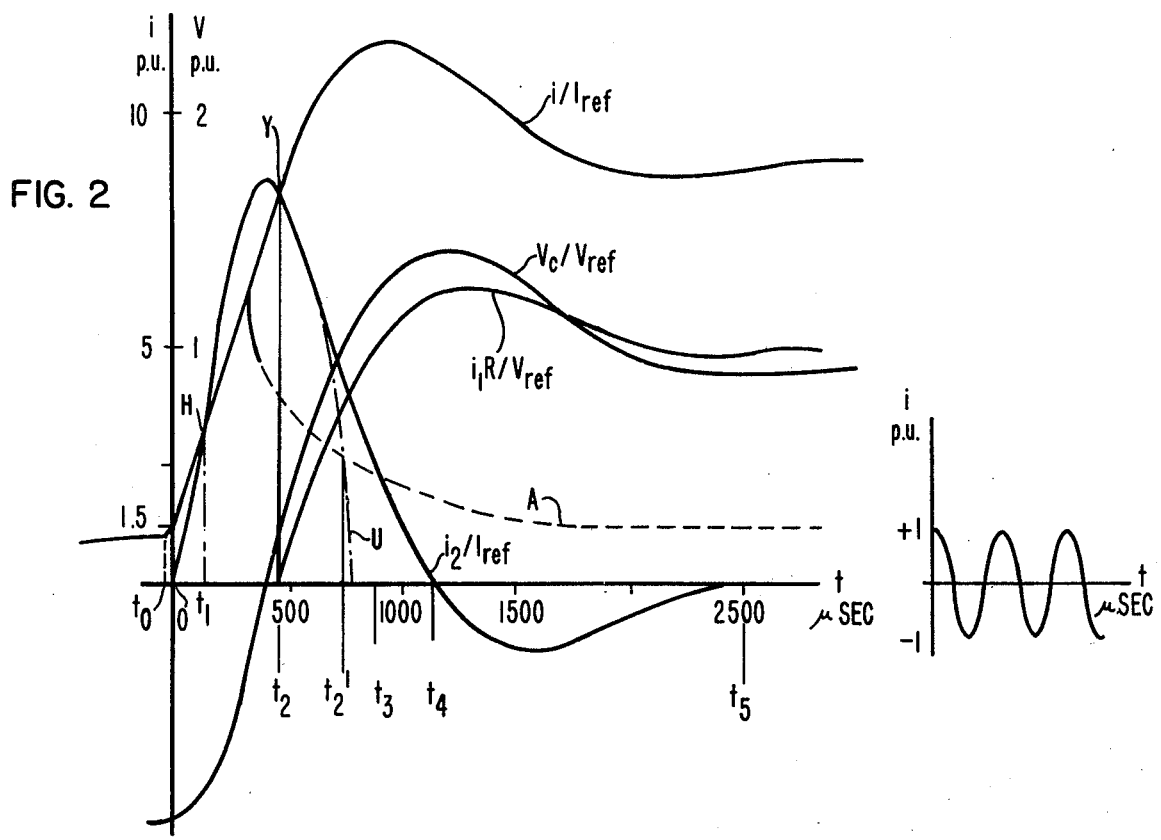
FIG. 2 shows plots of normalized circuit variables for soft bias, current commutation and limiting for a relatively low value of current limiting resistance.

Referring now to FIG. 1 and FIG. 2 together, the current commutating and limiting operation is described in further detail. To the right in FIG. 2, a per unit plot of the current i versus time t, with a time frame of milliseconds, is shown. To the left in FIG. 2 is shown a plot of current i versus time with a time frame in microseconds. In order to arrive at the plots shown in FIG. 2, a number of assumptions were made as the plots are essentially computer representations of the relationships of the various circuit variables. The event illustrated in FIG. 2 assumes a synthesized worst case fault resulting in both the highest rate of rise and the highest possible peak fault current in the system as shown in FIG. 1. Thus it is assumed that the instantaneous line current i prior to the fault is one per unit and is conducted by the thyristor stack TH1. This is shown to the right of FIG. 2 as was described previously. This coincides with an instantaneous one per unit system voltage E. It is further assumed that for the duration of the interruption transient the source voltage E remains at its maximum level. Since in reality the highest rate of rise of current and the highest peak first half cycle fault do not coincide, this provides a conservative assumption. At the time $t_0$, a bolted short circuit for example, occurs on the load side of the interrupter and the short circuit current i rapidly rises at a rate $E/L_s$. At $t=0$, the fault current reaches the 1.5 P.U. trip level and forced commutation is triggered by the sensing circuit CC. As was mentioned previously triggering consists of the following simultaneous events:

Spark gaps G1 and G1' are ignited.
Thyristor stack TH2 is gated on.
Gating is removed from the thyristor stack TH1.

This sequence of events permits capacitor C (precharged to one per unit voltage) to discharge through inductor L and the thyristor TH2. Initially, this sinusoidal discharge current $i_2$ is less than the line current i and thus the switch current i still flows through the thyristor TH1. At the time $t_1$ the net switch current drops to zero and then reverses because $i_2$ exceeds i. Therefore, TH1 ceases to conduct and the net switch current $i-i_2$ now flows through thyristor TH2. The resulting soft forward voltage drop of the thyristor TH2 appears across the thyristor TH1 in the reverse direction. Since the voltage drop across the entire switch is negligible, the fault current, i.e. line current i, keeps rising unimpeded. Similarly, discharge current $i_2$ pursues its sinusoidal resonant discharge course as is shown in FIG. 2. As is known, such discharge occurs at an angular frequency $\omega = 1/\sqrt{LC}$ and reaches an amplitude $I_2$ peak $= V_{CO}\sqrt{C/L}$, where $V_{CO}$ is the initial charge of the capacitive element C. Proper selection of the capacitive element C, the inductive element L and the precharged voltage $V_{CO}$ insures that the resonant discharge current $i_2$ does indeed overtake the fault current i at the point H shown in FIG. 2 and results in extinction and reverse biasing of the conducting thyristor TH1. This reverse biasing is present until the time $t_2$ when the previously described current relationships reverse. The reverse bias time $t_2-t_1$ may be, for example, 360 microseconds which is adequate to permit recovery of the thyristor. After time $t_2$ the line current i is larger than the discharge current $i_2$. However, the net switch current cannot reverse because the thyristor TH1 has been rendered non-conductive and the thyristor TH2 is blocking in the reverse direction. Thus, the line current i is now forced to flow through the force commutating branch including the capacitor C and inductor L and through the bypass resistor R satisfying the equation $i = i_1 + i_2$. At this point, the current $i_1$ and the resultant voltage drop $i_1 R$ now increase and the latter is in opposition to the source voltage E. At the time $t_3$ it reaches one P.U. As a result, fault current i which, by time $t_3$ has reached 11.5 P.U. finally begins to decrease. With a capacitor voltage $V_C$ now reversed and increasing in the reverse direction, discharge current $i_2$ also decreases and reaches zero at time $t_4$. By then, however, due to the resonant phenomenon, the capacitor voltage $V_C$ has overcharged to 1.42 P.U. Assuming that the spark gaps are fired again, a negative discharge current $i_2$ will bring back the capacitor voltage to about the one P.U. level while the fault current reaches its final 9 P.U. level as determined by the value of the resistance R. After time $t_5$, the line current i flows through the resistor R and the current limiting action is essentially completed.

Figure 3:
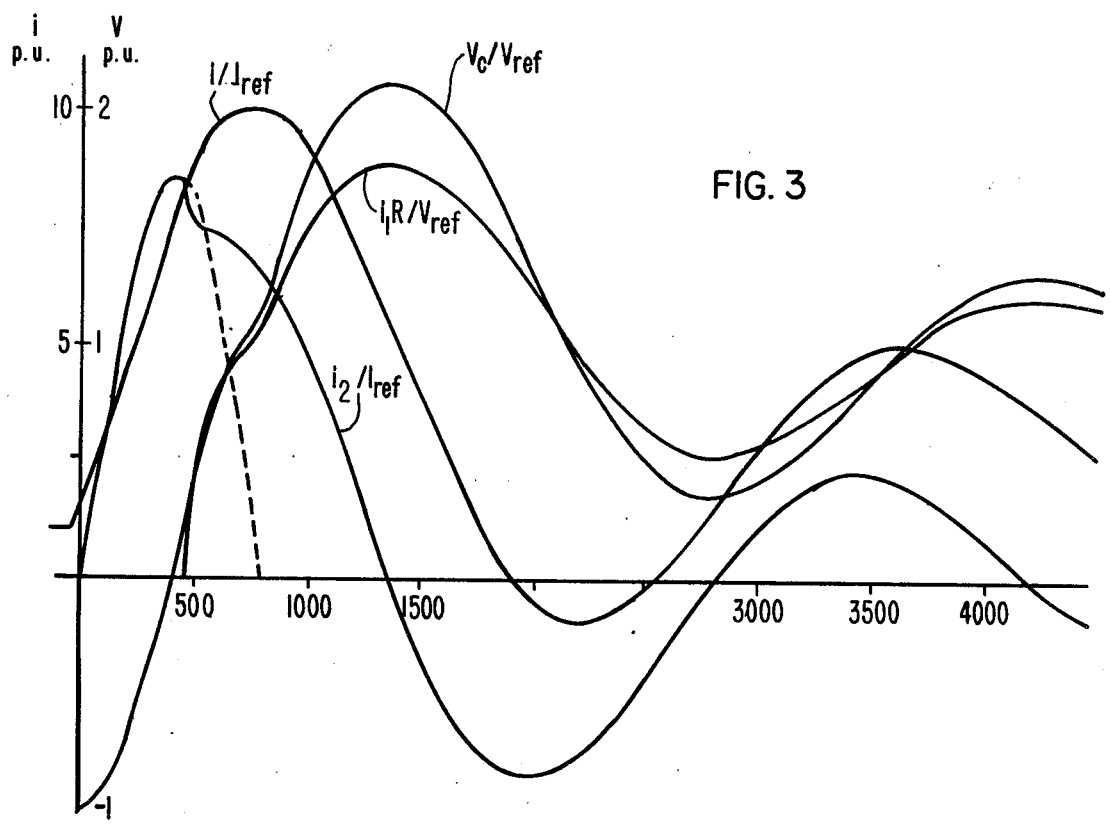
FIG. 3 shows a plot similar to that shown in FIG. 2 but where a relatively higher value of current limiting resistance is utilized.

If a more effective current limiting action is required, the value of the resistor R must be increased. By referring to FIG. 3 as well as FIGS. 2 and 1, the result of this can be shown. A current limiting event with the final limiting current set to three per units of i rather than nine per units of i is illustrated in the graphs of FIG. 3. All four parameters remain unchanged. However, the value of resistance is increased from the arbitrarily chosen value of 1/9 P.U. to ⅓ P.U. ohms which is necessary to obtain the required factor of three reductions.

However, the final current response in the system turns out to be far more oscillatory. This presents somewhat of a disadvantage in that the peak voltage across the switch may ring up to 1.8 per unit (where it was 1.25 per unit before) and the peak capacitor voltage may ring up to 2.1 per unit (where in was 1.42 per units before). In order to handle the increased voltage stress, a larger number of thyristors must be connected in series resulting in higher costs and higher losses, and a larger voltage capacitor C must be applied also at increased cost.

Figure 4:
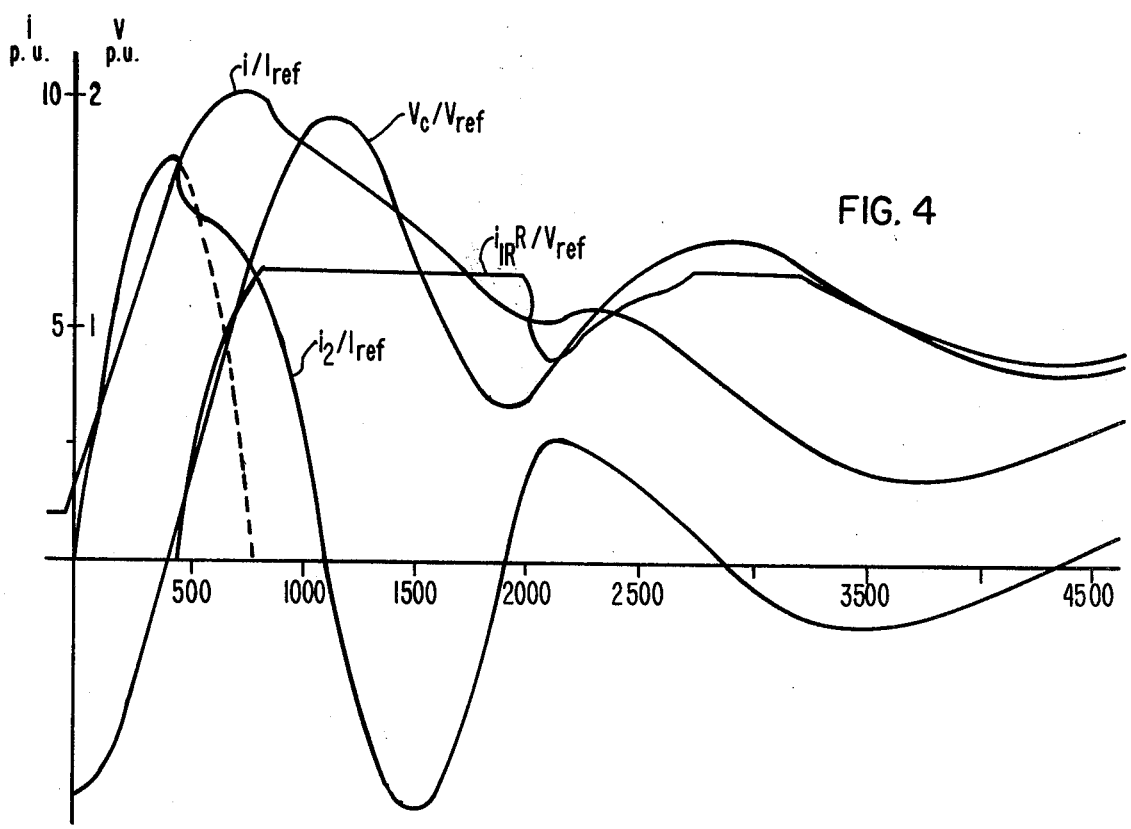
FIG. 4 shows a plot similar to that of FIGS. 2 and 3 but where main thyristor surge suppression is utilized.

Referring now to FIG. 4, a graph which shows the effect of curtailed voltage stresses with intensive current limiting is depicted. In this case the utilization of a larger number of thyristors may be avoided. This arrangement utilizes non-linear surge suppressors SS1 connected across the parallel pairs of reverse connected thyristors TH1 and TH2 as shown in FIG. 1. The conductivity of the surge suppressors SS1 increases exponentially with voltage. As a first approximation, modern surge suppressors, which may be made of sintered metal oxides such as zinc oxide, display essentially infinite resistance below a certain "clamp" voltage level and virtually zero resistance above this level. The operation of the interrupter as depicted in FIG. 4 is such that the voltage clamp level is set at 1.25 per units for the thyristors TH1. It can be seen that the switch voltage is now effectively kept below or at the 1.25 per unit level without adverse effects on the remainder of the operation. The plot of FIG. 4 shows a current $i_{1R}$ which is that part of current $i_1$ flowing through the resistor R. The remaining part $i_{1S}$ flows through the suppressor SS1. Its plot is not shown in FIG. 4 for purposes of simplicity. The capacitor voltage, however, still rings up to a value of 1.9 per unit as was the case with respect to the embodiment depicted in the graphs of FIG. 3.

Figure 5:
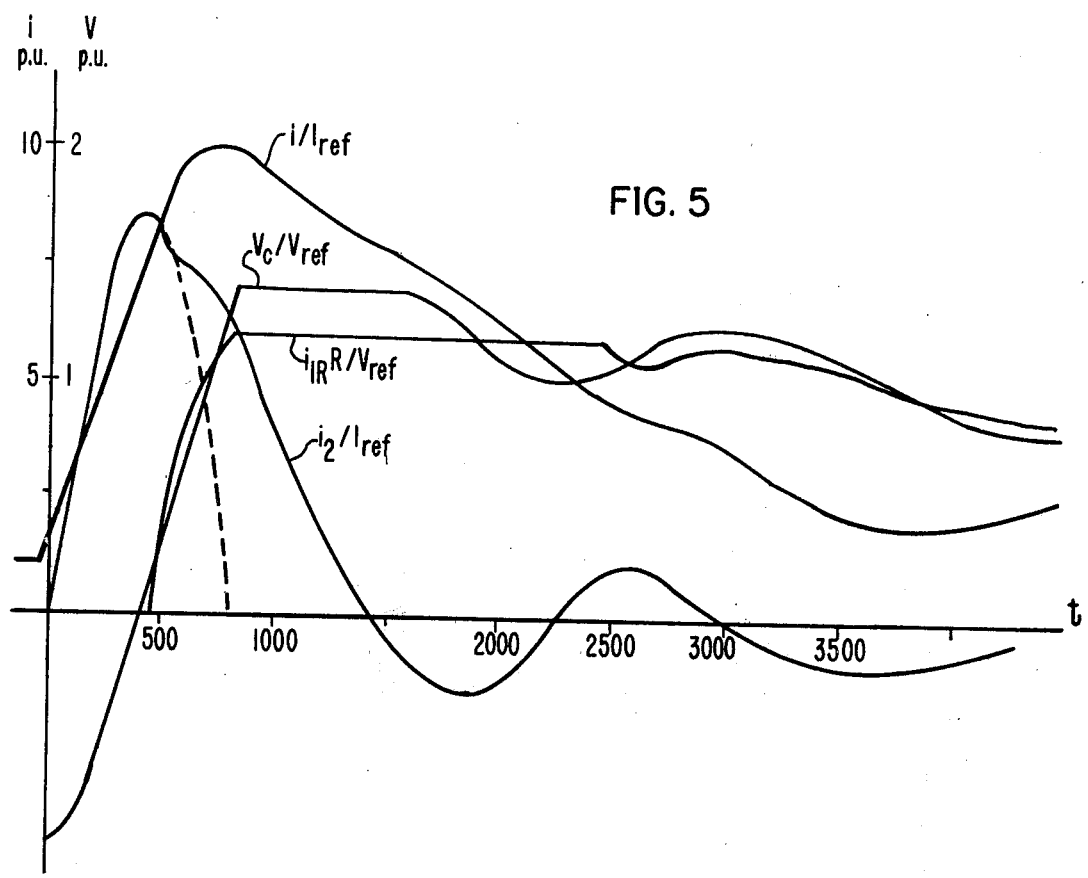
FIG. 5 shows a plot similar to that of FIGS. 2, 3 and 4 but where capacitive voltage surge suppression is also utilized.

Referring now to FIG. 5 as well as FIG. 1, it can be seen that surge suppressing apparatus can be used to curtail the capacitor voltage as well as the thyristor voltage. The surge suppressor SS2 is connected across the capacitor C. In order to have a sufficient voltage difference to force the discharge current $i_2$ for the capacitor C to zero, it is desirable to set the clamp level of the suppressor SS2 higher than that of the suppressor SS1. It is, therefore, assumed that the switch voltage is clamped at 1.2 per units by the surge suppressor SS1 and that the capacitor voltage is clamped at 1.4 per units by the surge suppressor SS2. All other parameters remain unchanged. The plot of FIG. 5 clearly illustrates that the operation of the interrupter is essentially unimpaired. It can also be seen that as soon as the switch voltage and the capacitor voltage dip below the clamp levels the relatively poorly damped oscillatory condition which was introduced earlier reappears. The main drawback in a situation such as this is the repeated polarity reversal of the capacitor discharge current $i_2$.

Figure 6:
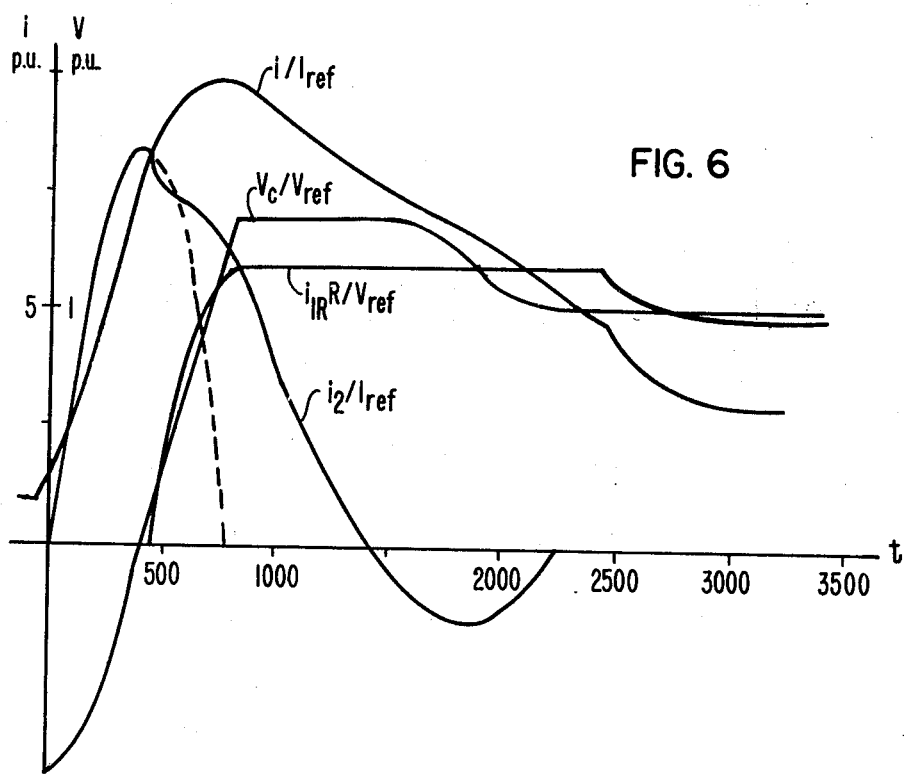
FIG. 6 shows a plot similar to FIGS. 2, 3, 4 and 5, but where capacitive element discharge reversal control is utilized.

Referring now to FIG. 6 as well as FIG. 1, the removal of this last obstacle is illustrated. In this situation, only one current discharge reversal for the current $i_2$ is permitted by the deliberate refusal to refire the appropriate spark gaps. Operation of the switch under these conditions with all other parameters unchanged is essentially shown in FIG. 6. It can be seen that the use of the surge suppressors SS1 and SS2 combined with the single reversal of the discharge current results in an excellently damped operation despite intensive current limiting at the three per unit level at the same time that maximum switch voltage is limited to 1.2 per unit and the maximum capacitor voltage is limited to 1.4 per unit. It should be noted that in a conventional AC application, clamping voltages of surge suppressors cannot be set this close to the peak AC voltage because the "standby" losses of the suppressors (SS1, for example) become destructive. In this situation, however, the suppressors are not normally exposed to the peak system voltage because in normal operation one set of thyristors or the other bypasses or essentially short circuits the suppressors SS1 so that the voltage across them is relatively low. Therefore, they only see the negligible low forward drop of the thyristors when the thyristors are in a state of conduction. The only time that the surge suppressors SS1 are exposed to elevated voltages is during the few cycles following the fault interruption. During this time, the thermal stress is significant. As an example, the surge suppressors SS2 of FIG. 1 must conduct the entire discharge current $i_2$ during the interval when the voltage of the capacitor C is clamped. Furthermore, the duty of the surge suppressor SS1 of FIG. 1 as illustrated in FIGS. 4, 5 and 6 can be calculated from the following equations:

$$i = i_1 + i_2 \tag{1}$$

$$i_1 = i_{1R} + i_{1S} \tag{2}$$

$$i_{1R} = V\text{clamp}/R, \text{ consequently} \tag{3}$$

$$i_{1S} = i - i_2 - (V\text{clamp}/R) \tag{4}$$

The energy absorbed by the suppressors during an interruption event is the current-time integral multiplied by the clamp voltage. Note that the energy dissipated by the various surge suppressors is a function of the fault current. The previous examples represent worst case faults made even more demanding by the conservative simplifiying assumption that during the interruption interval, which is about 2 milliseconds, the instantaneous source voltage remains at a peak level. Statistically, most faults will result in less dissipation.

Figure 2A:
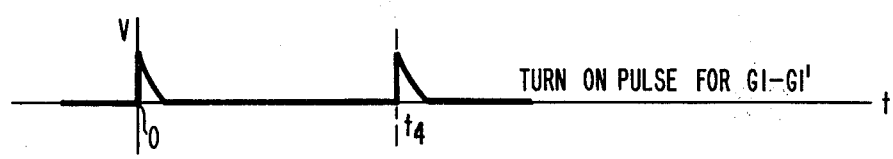
FIG. 2A shows a plot of the turn-on pulse for the controllable spark gaps of FIG. 1.
Figure 2B:
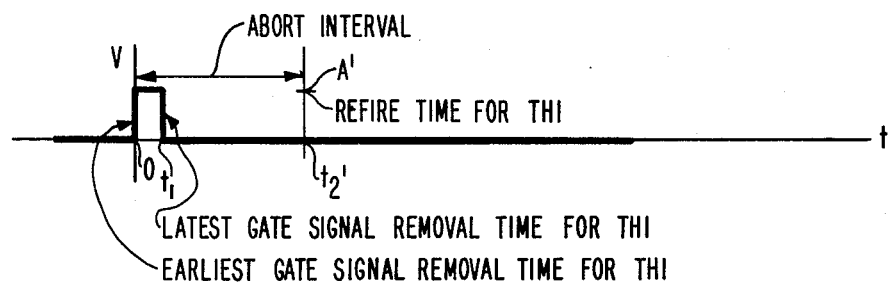
FIG. 2B shows a plot of the control signal for the thyristors of FIG. 1 for different circuit considerations.

By referring once again to FIGS. 1 and 2 as well as FIGS. 2A and 2B, another operating feature is shown for the purpose of eliminating the effect of nuisance trips. Solid state current limiting interrupters require electronic sensing and trip circuits such as CVM which can determine the presence of short circuits and initiate a current limiting operation virtually instantaneously. Lacking the time necessary to identify and subsequently ignore subcycle disturbances creates an opportunity for nuisance trips. Soft commutating circuits, however, offer the possibility to reconsider a limiting operation even after the forced commutation process has been initiated. As can be seen in FIG. 1, the line current i and the discharge current $i_2$ develop independently of each other until a time $t_2$ when the line current i overtakes the discharge current $i_2$ at the point Y. Therefore, during the interval $t_0$ to $t_2$, the electronic sensing circuit CC has the opportunity to verify whether the initiation of current limiting at $t_0$ is still warranted. If current limiting is not required after reconsideration, refiring the thyristor TH1 at the time $t_2$, for example, will permit the load current i to follow the natural course and the discharge current $i_2$ to complete its sinusoidal half cycle as shown by the dotted line at U without the two currents affecting each other at the end of this discharge half cycle. The capacitor voltage is found to be reversed; however, reversal to the original starting condition can be accomplished relatively easily through the precharged circuit PC. By noting the discharge path at curve A, it can be seen that the time for calculating whether current limiting is actually required after initiation can be extended to a time $t_2'$ where the transient current represented by the dotted line of curve A exceeds the tuned discharge current $i_2$ represented by the dotted line of curve U. In such a situation, the remainder of the circuit does not see that a current limiting action has begun.

Referring now specifically to FIG. 2A, a plot of the turn-on voltage or firing voltage for the spark gaps G1 and G1' is shown. It will be noted that the turn-on voltage is applied at the time zero in the graph of FIG. 2.

Referring now to FIG. 2B, a plot of the firing pulse for the gate of the thyristor TH1, for example, is shown. It will be noted that the earliest gate signal removal for the thyristor TH1 occurs at the time $t_0$, and the turn-off occurs at the time $t_1$. Consequently, the gate signal must be removed from the thyristor TH1 before the zero crossing at H in FIG. 2. Otherwise, the soft biasing technique will be ineffective. Likewise, in the event that it is desirous to abort the current limiting and commutating operation as was described previously at the time $t_2'$, it is necessary to have a gate pulse present on the thyristor TH1 at the time $t_2'$ such as is shown at A' in FIG. 2B.

It is to be understood, with respect to the embodiments of this invention that the turn-on pulse shown in FIG. 2A can be applied to the spark gaps G2 and G2' equally well. It is also to be understood that the various turn-off and refiring times associated with FIG. 2B for the thyristor TH1 apply equally well for the thyristor TH2. It is also to be understood that, although the surge suppressing apparatus SS1 is shown connected in parallel when one device per thyristor in FIG. 1, the entire stack of surge suppressing devices may be connected in parallel with the entire stack of thyristor elements TH1 and TH2 without the intermediate interconnections shown in FIG. 1 at K, for example. It is also to be understood that the the graphs of FIGS. 2 through 6 in which the currents i, $i_1$ and $i_2$ for example, and the voltage $V_C$ are normalized against references, is merely illustrative and does not affect the utilization of the non-normalized numerator values thereof. It is also to be understood that the current limiting operation works equally well for negative half cycles of line current an voltage as for positive half cycles. It is also to be understood that although spark gaps are desirable in the preferred embodiment of the invention, any switching device which accomplishes the results accomplished by the spark gaps for the conditions set forth may be utilized in place thereof. It is also to be understood that the utilization of an inductive source impedance $L_S$ is merely illustrative. It is also to be understood that the backup protection BP although described as a mechanical circuit breaker, may be any suitable protective device. It is also to be understood that the operating frequency is not limited to 60 Hz. It is also to be understood that the numbers used in the examples associated with FIGS. 2 through 5, for example, are not limiting.

The apparatus taught with respect to the embodiments of this invention have many advantages. One advantage lies in the fact that the soft commutating technique may be utilized with the normally conducting main path thyristor circuits so that the thyristors provide a dual function of main path conduction and soft biasing. Another advantage lies in the fact that the apparatus taught herein provides a current limiting and commutation abort feature. Another advantage lies in the fact that tuned discharge current may be utilized for effective reverse biasing or soft biasing. Another advantage lies in the fact that surge suppressors may be utilized with respect to the main conducting thyristors and the energy storage means to prevent excessively high transient voltage from developing thereacross when combined with the effective damping of the otherwise oscillatory system transients. Another advantage lies in the fact that the discharge circuit for the energy storage means or capacitor C may be appropriately interrupted to prevent repeated current reversals.

What I claim as my invention is:

1. A current limiting switch, comprising:
   (a) a pair of terminal means connectable to an electrical circuit in which alternating current flows;
   (b) first gated means connected between said pair of terminal means for passing said alternating current therethrough in one circuit direction;
   (c) second gated means connected between said pair of terminal means for passing said alternating current therethrough in the other circuit direction;
   (d) current limiting means connected between said pair of terminal means for passing said alternating current therethrough in both said circuit directions for thus performing a current limiting operation on said alternating current during an appropriate period of time;
   (e) normally off switchable stored energy means connected between said pair of terminal means; and
   (f) control means connected to said stored energy means and to said first gated means for switching said switchable stored energy means on and for rendering said first gated means conductive during a portion of said appropriate period of time for thus providing electrical current to said first gated means from said energy storage means when said second gated means has been rendered non-conductive during said portion of said appropriate period of time, said current from said stored energy means when flowing through said first gated means cooperating with the intrinsic impedance thereof to provide a forward voltage drop across said first gated means which provides soft reverse bias voltage for said second gated means, the presence of said soft reverse bias voltage continuing for the recovery time of said second gated means to prevent reconduction of said circuit alternating current through said second gated means, said current limiting means performing said current limiting operation at this time.

2. The combination as claimed in claim 1, wherein said first gated means comprises a first thyristor means and said second gated means comprises a second thyristor means.

3. The combination as claimed in claim 2, wherein said first direction and said other direction are 180 degrees displaced.

4. The combination as claimed in claim 2, wherein said current limiting means comprises a resistor.

5. The combination as claimed in claim 2, wherein said portion of said appropriate period of time begins with the beginning of said appropriate period of time.

6. The combination as claimed in claim 2, wherein said switchable controlled energy means includes a spark gap which is actuable by said control means.

7. The combination as claimed in claim 2, wherein surge suppressor means is connected between said pair of terminal means to limit the voltage impressed across said first and said second thyristor means during said current limiting operation.

8. The combination as claimed in claim 2, comprising surge suppressor means connected across said stored energy means for limiting the voltage impressed thereacross during said current limiting operation.

9. The combination as claimed in claim 1, comprising surge suppressing means connected between said pair of terminal means, said surge suppressing means having a clamping voltage, said clamping voltage being higher than the peak voltage of said alternating current system between said terminal means during a non-current limiting time, but said clamping voltage being lower than the peak voltage value of said current limited alternating current system, said clamping voltage also being lower than the breakdown voltage of said first gated means to thereby protect said first gated means during a current limiting operating by limiting the voltage of said current limited alternating current to said clamping surge voltage.

10. The combination as claimed in claim 9, wherein said first gated means and said second gated means comprises first and second thyristor means, respectively.

11. The combination as claimed in claim 1, comprising surge suppressing means connected between said pair of terminal means, said surge suppressing means having a clamping voltage, said clamping voltage damping oscillatory system transients.

12. The combination as claimed in claim 1, comprising surge suppressor means connected across said stored energy means, said surge suppressor means having a clamping voltage, said clamping voltage limiting the voltage drop across said stored energy means to a value less than its breakdown voltage.

13. The combination as claimed in claim 11, wherein said stored energy device comprises a capacitor means.

14. The combination as claimed in claim 1, comprising surge suppressing means connected across said stored energy means, said stored energy means having a clamping voltage, said clamping voltage damping oscillatory system transients.

15. A current limiting switch, comprising:
(a) a pair of terminal means connectable to an electrical circuit in which alternating current flows;
(b) controllable bidirectional switch means connected between said pair of terminal means for passing said alternating current therethrough, a biasing portion of said bidirectional switch means requiring a biasing voltage to be developed thereacross for a predetermined time to prevent reconduction of said bidirectional switch means when said bidirectional switch means has been turned off;
(c) current limiting means connected between said pair of terminal means for limiting said alternating current when said bidirectional switch has been turned off;
(d) switchable stored energy means connected to said biasing portion of said bidirectional switch means for providing biasing alternating current thereto when said switchable stored energy means has been switched on, said bias current cooperating with said biasing portion to provide said biasing voltage; and
(e) control means for switching said stored energy means on, said control means allowing N reversals of said biasing alternating current after which said stored energy means is prevented from providing further biasing alternating current.

16. The combination as claimed in claim 15, wherein N=1.

17. A current limiting switch, comprising:
(a) a pair of terminal means connectable to an electrical circuit in which alternating current flows;
(b) unidirectional conduction means connected between said pair of terminal means for passing said alternating current therethrough in one circuit direction;
(c) gated unidirectional conduction means connected between said pair of terminal means for passing said alternating current therethrough in the other circuit direction;
(d) current limiting means connected between said pair of terminal means for passing said alternating current therethrough in both said circuit directions for performing a current limiting operation on said alternating current during an appropriate period of time;
(e) normally off switchable stored energy means connected between said pair of terminal means; and
(f) control means for switching said switchable stored energy means on at a first time for providing electrical current to said unidirectional conduction means when said gated unidirectional conduction means has been rendered non-conductive by a de-energization of the gate thereof during a portion of said appropriate period of time, said portion of time beginning at the time said current from said stored energy means exceeds said alternating current and ending where said alternating current once again exceeds said current from said stored energy means, said current from said stored energy means flowing through said unidirectional conduction means to cooperate with the intrinsic impedance thereof to provide a forward voltage drop thereacross which in turn provides soft reverse bias voltage for said gated unidirectional conduction means, said control means having the capability of determining if said current limiting operation may be aborted during a period of time beginning at said first time and ending at the end of said portion of said appropriate period of time, said control means aborting said current limiting operation in response to said later determination no later than the end of said portion of said appropriate time by reenergizing the gate of said gated unidirectional conductive means.

* * * * *